(12) United States Patent  
Matsui

(10) Patent No.: US 9,281,052 B2  
(45) Date of Patent: Mar. 8, 2016

(54) SEMICONDUCTOR DEVICE HAVING DATA TERMINAL SUPPLIED WITH PLURAL WRITE DATA IN SERIAL

(71) Applicant: PS4 Luxco S.a.r.l., Luxembourg (LU)

(72) Inventor: Yoshinori Matsui, Tokyo (JP)

(73) Assignee: PS4 LUXCO S.A.R.L., Luxembourg (LU)

( * ) Notice: Subject to any disclaimer, the term of this patent is extended or adjusted under 35 U.S.C. 154(b) by 0 days.

(21) Appl. No.: 14/657,683

(22) Filed: Mar. 13, 2015

(65) Prior Publication Data

US 2015/0187411 A1  Jul. 2, 2015

Related U.S. Application Data

(63) Continuation of application No. 13/715,995, filed on Dec. 14, 2012, now Pat. No. 9,007,868.

(30) Foreign Application Priority Data

Dec. 14, 2011  (JP) ................. 2011-273433

(51) Int. Cl.
| | |
|---|---|
| G11C 5/06 | (2006.01) |
| G11C 11/4096 | (2006.01) |
| G11C 7/22 | (2006.01) |
| G11C 8/18 | (2006.01) |
| G11C 7/10 | (2006.01) |

(52) U.S. Cl.
CPC .......... *G11C 11/4096* (2013.01); *G11C 7/1066* (2013.01); *G11C 7/1093* (2013.01); *G11C 7/222* (2013.01); *G11C 8/18* (2013.01); *G11C 2207/107* (2013.01)

(58) Field of Classification Search
USPC ................... 365/233.1, 193, 191, 63
See application file for complete search history.

(56) References Cited

U.S. PATENT DOCUMENTS

| 5,422,858 A | * | 6/1995 | Mizukami et al. ........ 365/233.12 |
| 6,211,703 B1 | * | 4/2001 | Takekuma .......... G06F 13/4077 326/101 |
| 2006/0158259 A1 | * | 7/2006 | Ishizaka .................... H03L 7/18 331/10 |
| 2011/0181320 A1 | * | 7/2011 | Wang .................. H03K 23/662 326/115 |

* cited by examiner

Primary Examiner — Vu Le

(57) ABSTRACT

Disclosed herein is a semiconductor device that includes: a frequency dividing circuit dividing a frequency of a first clock signal to generate second clock signals that are different in phase from one another; a multiplier circuit multiplying the second clock signals to generate a third clock signal; a data input/output terminal; data buses; and a data input/output circuit coupled between the data input/output terminal and the data buses. The data input/output circuit includes a data output circuit and a data input circuit. The data output circuit outputs read data supplied in parallel from the data buses to the data input/output terminal in serial in synchronism with the third clock signal. The data input circuit outputs write data supplied in serial from the data input/output terminal to the data buses in parallel in synchronism with a predetermined one of the second clock signals.

17 Claims, 18 Drawing Sheets

SEMICONDUCTOR DEVICE HAVING DATA TERMINAL SUPPLIED WITH PLURAL WRITE DATA IN SERIAL

CONTINUING DATA

This application is a continuation of U.S. patent application Ser. No. 13/715,995, filed Dec. 14, 2012, which claims the priority of Japanese Patent Application No. 2011-273433, filed Dec. 14, 2011, the contents of which prior applications are incorporated herein by reference.

BACKGROUND OF THE INVENTION

1. Field of the Invention

The present invention relates to a semiconductor device, and particularly to a semiconductor device having a data input circuit that receives a plurality of write data sets supplied in serial and outputs the write data sets to a plurality of data buses in parallel.

2. Description of Related Art

A DRAM (Dynamic Random Access Memory), which is one of typical semiconductor memory devices, generally has a DLL (Delay Locked Loop) circuit to accurately transfer data at high speed between the DRAM and a memory controller. The DLL circuit generates an internal clock signal that is phase-controlled with respect to an external clock signal supplied from the memory controller. The internal clock signal is used as a timing signal to output read data. Therefore, it is possible to accurately transfer data between the DRAM and the memory controller at high speed.

However, the DLL circuit consumes a relatively large amount of power. In a semiconductor memory device that is required so have low power consumption particularly for use in mobile devices, the DLL circuit may not be provided. In such a semiconductor memory device, not only a parallel-to-serial conversion of read data has been performed by using the internal, clock, signal that is not phase-controlled, but also the read data are output to an outside without being phase-controlled. Even during a writing operation, write data that are supplied in synchronism with a data strobe signal are converted from serial to parallel by using the internal clock signal that is not phase-controlled (See Japanese Patent Application Laid-Open No. 2011-108300).

For the parallel-to-serial conversion and the serial-to-parallel conversion, a plurality of frequency-divided clock signals are used. The frequency-divided clock signals are generated by dividing the frequency of an external clock signal, and are different in phase from one another. The frequency-divided clock signals are combined by a multiplier circuit to regenerate an internal clock signal that has the same frequency as the external clock signal. The parallel-to-serial conversion and the serial-to-parallel conversion are performed by using the regenerated internal clock signal. One example of a frequency dividing circuit, as well as of a multiplier circuit, is described in Japanese Patent Application Laid-Open No 2000-273103. The reason why the frequency dividing process and the multiplication process are performed is because, when the internal clock signal having a high-frequency is transmitted via a clock line having long wiring distance, the quality of the internal clock signal decreases due to parasitic capacitance components that the clock line has.

However, in order to transmit a plurality of frequency-divided clock signals via clock lines having long wiring distance, a plurality of drivers having high driving capability need to operate, resulting in consumption of a relatively large amount of power. It is desirable to reduce the transmission of frequency-divided clock signals as much as possible, thereby reducing power consumption. The same is required not only for semiconductor memory devices such as DRAM, but also for all semiconductor devices that are designed to regenerate an internal clock signal by multiplying a plurality of frequency-divided clock signals, and input and output data using the regenerated internal clock signal.

SUMMARY

In one embodiment, there is provided a semiconductor device that includes: a frequency dividing circuit dividing a frequency of a first clock signal to generate a plurality of second clock signals that are different in phase from one another; a multiplier circuit multiplying the second clock signals to generate a third clock signal; a data input/output terminal; a plurality of data buses; and a data input/output circuit coupled between the data input/output terminal and the data buses, the data input/output circuit including a data output circuit and a data input circuit, the data output circuit outputting a plurality of read data supplied in parallel front the data buses to the data input/output terminal in serial in synchronism with the third clock signal, and the data input circuit outputting a plurality of write data supplied in serial from the data input/output terminal to the data buses in parallel in synchronism with a predetermined one of the second clock signals.

In another embodiment, there is provided a semiconductor device that includes: a frequency dividing circuit configured to receive a first clock signal to generate a second clock signal having lower frequency than the first clock signal; a plurality of data buses; a data terminal supplied with a plurality of write data in serial; a data strobe terminal, supplied with a data strobe signal; a serial-to-parallel conversion circuit configured to convert the write data supplied via the data terminal from serial to parallel in synchronism with the data strobe signal; and a synchronizing circuit configured to output the write data in parallel to the data buses in synchronism with the second clock signal.

In still another embodiment, there is provided a semiconductor device that includes a memory cell array including a plurality of memory cells; a plurality of data buses receiving, in a data read mode, parallel-read-data from the memory cell array and supplying, in a data write mode, parallel-write-date to the memory cell array; a first clock circuit including a plurality of output nodes and configured to generate, in the data read mode, a plurality of first clock signals an the output nodes, respectively, and to generate, in the data write mode, at least one second clock signal at an associated one of the output nodes while stopping generation of clock signal or signals at remaining one or ones of the output nodes; a second clock circuit coupled to the output nodes of the first clock circuit and configured to produce, in the data read mode, a third clock signal in response to the first clock signals and, in the data write mode, a fourth clock signal in response to the second clock signal, the third clock signal being greater in frequency than the fourth clock signal; a data terminal; a date output circuit coupled to the data buses to convert the parallel-read-data into serial-read-data in response to the third clock signal, the data output circuit being coupled to the data terminal to drive the data terminal in response to the serial-read-data; and a data input circuit coupled to the data terminal to convert serial-write data into the parallel-write-data, the data output circuit coupled to the data buses to supply the parallel-write data to the data buses in response to the fourth clock signal.

DETAILED DESCRIPTION OF THE EMBODIMENTS

Figure 1:
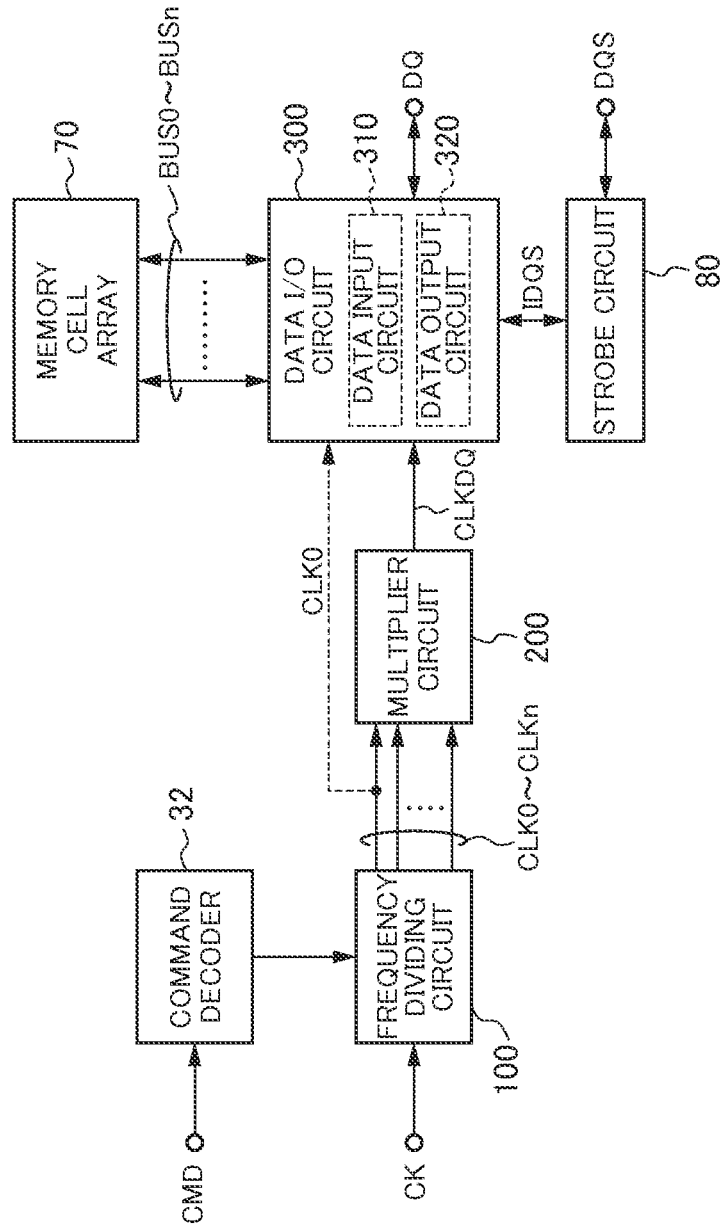
FIG. 1 is a block diagram indicative of a semiconductor device according to an embodiment of the present invention.

Referring now to FIG. 1, the semiconductor device according to the embodiment of the present invention includes a frequency dividing circuit 100 and a multiplier circuit 200. The frequency dividing circuit 100 divides the frequency of an external clock signal CK to generate a plurality of frequency-divided clock signals CLK0 to CLKn that are different in phase from each other. The multiplier circuit 200 multiplies a plurality of frequency-divided clock signals CLK0 to CLKn to generate an internal clock signal CLKDQ. The internal clock signal CLKDQ generated by the multiplier circuit 200 is supplied to a data input/output circuit 300. The data input/output circuit 300 includes a data input circuit 310 and a data output circuit 320.

The data input circuit 310 converts a plurality of write data sets DQ from serial to parallel in synchronism with an internal data strobe signal IDQS, and then outputs the write data sets DQ in parallel to data buses BUS0 to BUSn in synchronism with the internal clock signal CLKDQ. The internal data strobe signal IDQS is generated by a strobe circuit 80 based on an external strobe signal DQS supplied from outside. The data output circuit 320 converts read data DQ supplied from a memory cell array 70 via the data buses BUS0 to BUSn from parallel to serial, and outputs the read data DQ to the outside via a data input/output terminal. When the read data DQ are output to the outside, the external strobe signal DQS is also output from the strobe circuit 80 in synchronism with the output of the read data DQ.

A reading operation and a writing operation are performed based on a command signal CMD supplied to a command decoder 32. The command decoder 32 brings the frequency dividing circuit 100 into a first operation state when the command signal CMD indicates the reading operation. As a result, a plurality of frequency-divided clock signals CLK0 to CLKn that are different in phase from one another are generated. When the command signal CMD indicates the writing operation, the command decoder 32 brings the frequency dividing circuit 100 into a second operation state. As a result, among the above frequency-divided clock signals, only frequency-divided clock signal CLK0 is generated. That is, the other frequency-divided clock signals CLK1 to CLKn are not generated, and fixed to a predetermined logic level.

As a result, the frequency of the internal clock signal CLKDQ output from the multiplier circuit 200 is equal to the frequency of the external clock signal CK during the reading operation. During the writing operation, the frequency of the internal clock signal CLKDQ is lower than the frequency of the external clock signal CK. That is, during the writing operation, one frequency-divided clock signal CLK0 is supplied directly to the data input circuit 310.

As described above, during the writing operation, only frequency-divided clock signal CLK0 is generated among the above frequency-divided clock signals CLK0 to CLKn. The other frequency-divided clock signals CLK1 to CLKn are not generated. Meanwhile, a plurality of write data sets DQ that are supplied in serial have been already converted to a parallel form in synchronism with the internal data strobe signal IDQS. Therefore, only one type of internal clock signal is enough to specify the timing of outputting data to the data buses BUS0 to BUSn. The present embodiment focuses on the above fact. In the present embodiment, only the frequency-divided clock signal CLK0 is generated during the writing operation, and is supplied to the multiplier circuit 200. Therefore, the semiconductor device of the present embodiment can reduce power consumption during the writing operation.

In particular, if a layout of the frequency dividing circuit 100 is significantly remote from a layout of the multiplier circuit 200 on a semiconductor chip, a clock line that connects the frequency dividing circuit 100 to the multiplier circuit 200 becomes quite long. In this case, a high drive capability is required for driver circuits that output the frequency-divided clock signals CLK0 to CLKn, and the operation consumes a large amount of power. However, the semiconductor device of the present embodiment can reduce power consumption because what is transmitted during the writing operation is only the frequency-divided clock signal CLK0.

Figure 2:
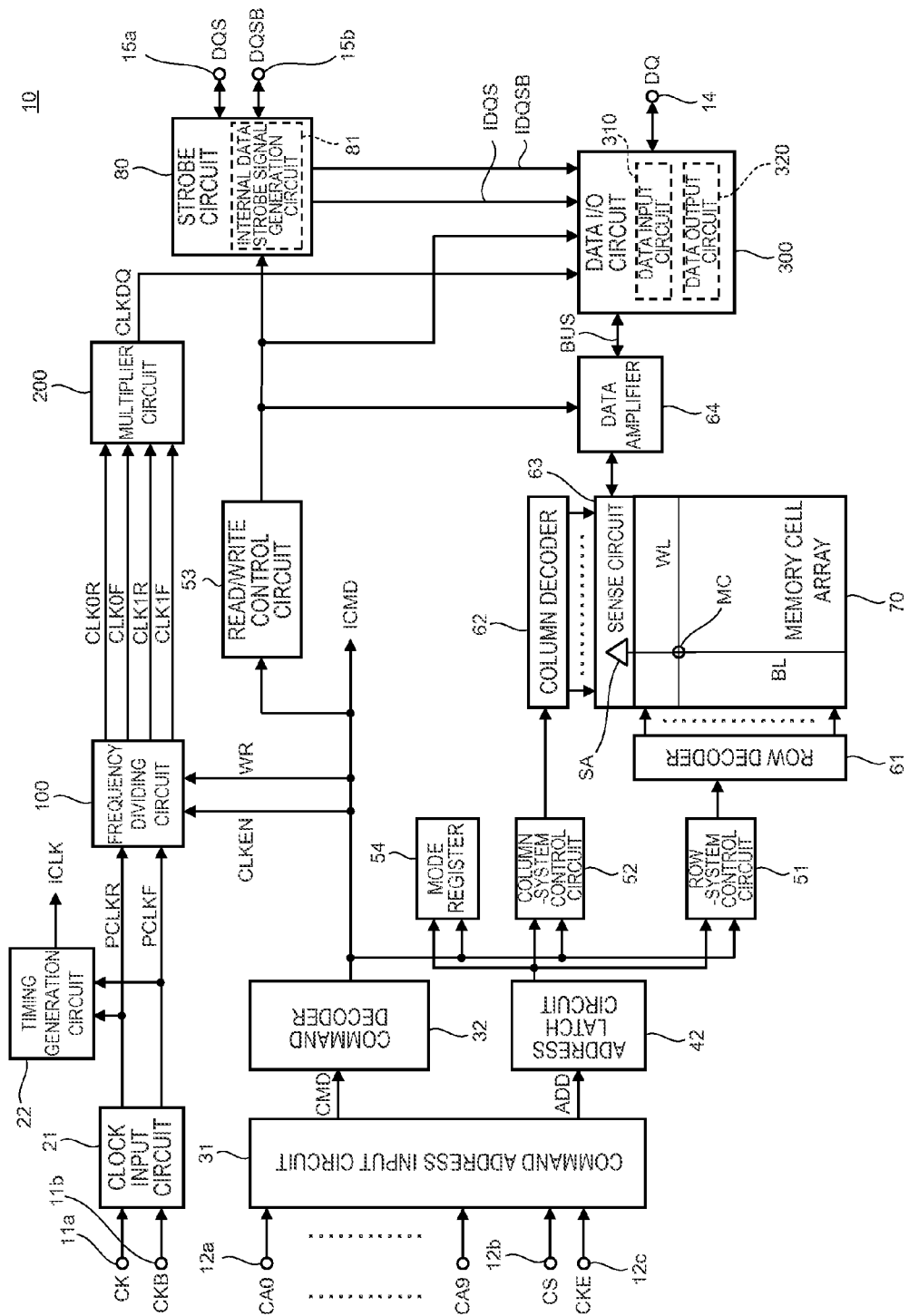
FIG. 2 is a block diagram indicative of a configuration of a semiconductor device according to an embodiment of the present invention.

More specific embodiment of the present invention will be explained with reference FIG. 2. The semiconductor device 10 shown in FIG. 2 is a DRAM and has external terminals that include clock terminals 11a and 11b, command address terminals 12a, a chip selection terminal 12b, a clock enable terminal 12c, a data input/output terminal 14, and data strobe terminals 15a and 15b. While the semiconductor device 10 also includes a power source terminal or the like, these elements are not shown in FIG. 2.

The clock terminals 11a and 11b are supplied with external clock signals CK and CKB, respectively. The external clock signals CK and CKB are transferred to a clock input circuit 21. In the present specification, a signal whose name ends with "B" is an inverted signal of a corresponding signal or low-active signal. Accordingly, the external clock signals CK and CKB are complementary to each other.

Figure 3:
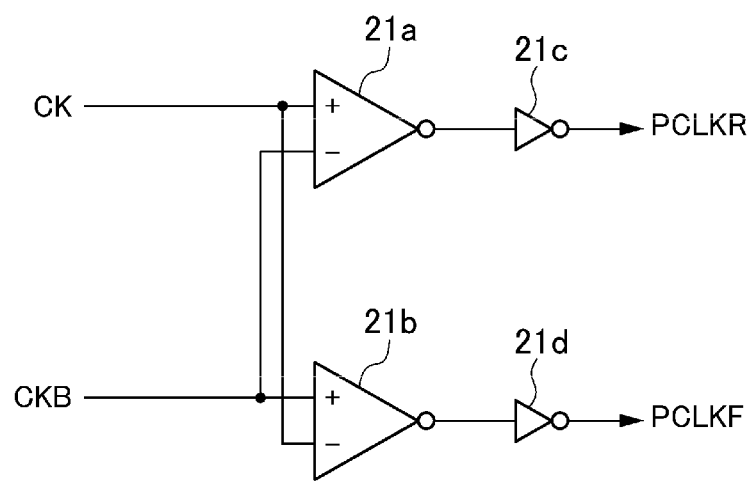
FIG. 3 is a circuit diagram indicative of a clock input circuit shown in FIG. 2.

Turning to FIG. 3, the clock input circuit 21 includes a pair of receiver circuits 21a and 21b that receives the external clock signals CK and CKB. The clock input circuit 21 further includes inverter circuits 21c and 21d that receive output signals of the receiver circuits 21a and 21b, respectively. The output signals of the inverter circuits 21c and 21d are used as internal clock signals PCLKR and PCLKF, respectively. The receiver circuit 21a includes an non-inverting input node (+) supplied with the external clock signal CK and an inverting input node (−) supplied with the external clock signal CKB. The receiver circuit 21b includes an non-inverting input node (+) supplied with the external clock signal CKB and an inverting input node (−) supplied with the external clock signal CK. As a result, the waveform of the internal clock signal PCLKR becomes substantially identical to the waveform of the external clock signal CK. The waveform of the internal clock signal PCLKF becomes substantially identical to the waveform of the external clock signal CKB. Therefore, according to the present embodiment, the internal clock signals PCLKR and PCLKF can be regarded being the same as the external clock signals CK and CKB, respectively. According to the present specification, the internal clock signals PCLKR and PCLKF may also be referred to as "first clock signals".

Returning to FIG. 2, the internal clock signals PCLKR and PCLKF that are output from the clock input circuit 21 are supplied to a timing generation circuit 22 and the frequency dividing circuit 100. The timing generation circuit 22 generates various internal clocks ICLK, and supplies the internal clocks ICLK to various internal circuits. The frequency dividing circuit 100 divides the frequency of the internal clock signals PCLKR and PCLKF to generate four frequency-divided clock signals CLK0R, CLK0F, CLK1R, and CLK1F that are different in phase from one another. The frequency of the frequency-divided clock signals CLK0R, CLK0F, CLK1R, and CLK1F is one-half of the frequency of the external clock signal CK. The phase difference therebetween is one-half of a clock cycle of the internal clock signals PCLKR and PCLKF. The specific circuit configuration of the frequency dividing circuit 100 will be described later. According to the present specification, the frequency-divided clock signals CLK0R, CLK0F, CLK1R, and CLK1F may also be referred to as "second clock signals". According to the present embodiment, the frequency dividing circuit 100 is used to generate four phases of frequency-divided clock signals. However, the present invention is not limited to four phases of frequency-divided clock signals. For example, the frequency dividing circuit 100 may be used to generate eight phases of frequency-divided clock signals. The frequency-divided clock signals CLK0R, CLK0F, CLK1R, and CLK1F are supplied to the multiplier circuit 200.

The multiplier circuit 200 generates the internal clock signal CLKDQ by multiplying the frequency-divided clock signals CLK0R, CLK0F, CLK1R, and CLK1F. The frequency of the internal clock signal CLKDQ generated by the multiplier circuit 200 is equal to the frequency of the external clock signal CK. That is, the multiplier circuit 200 multiplies the frequency-divided clock signals CLK0R, CLK0F, CLK1R, and CLK1F, whose frequency has been divided by the frequency dividing circuit 100 so as to be one-half of the frequency of the external clock signal CK, to regenerate the internal clock signal CLKDQ, the frequency of which is equal to the frequency of the external clock signal CK. The internal clock signal CLKDQ is supplied to a data input/output circuit 300. In the present specification, the internal clock signal CLKDQ may also be referred to as "third clock signal".

The command address terminals 12a are supplied with command address signals CA0 to CA9 that constitute the command signal CMD and the address signal ADD. The chip selection terminal 12b is a supplied with a chip selection signal CS. The clock enable terminal 12c is supplied with a clock enable signal CKE. These signals CA0 to CA9, CS and CKE are supplied to a command address input circuit 31. Among these signals supplied to the command address input circuit 31, the command signal CMD, the chip selection signal CS, and the clock enable signal CKE are supplied to a command decoder 32, and the address signal ADD is supplied to an address latch circuit 42.

The command decoder 32 generates various internal commands ICMD by performing a process of retaining, decoding, and counting command signals in synchronism with the internal clock signal ICLK. The internal commands ICMD are supplied to a row system control circuit 51, a column system control circuit 52, a reading/writing control circuit 53, and a mode register 54. As shown in FIG. 2, the enable signal CLKEN and write signal WR contained in the internal commands ICMD are supplied to the frequency dividing circuit 100. The enable signal CLKEN becomes activated at a time when the command signal CMD indicates a read command or a write command. The write signal WR becomes activated at a time when the command signal CMD indicates a write command.

The address latch circuit 42 latches the address signal ADD in synchronism with the internal clock signal ICLK. Out of the address signals ADD latched by the address latch circuit 42, a row address is supplied to the row-system control circuit 51, and a column address is supplied to the column-system control circuit 52. During an entry to a mode register set operation, the address signal ADD is supplied to the mode register 54, thereby the content of the mode register 54 is overwritten.

An output signal of the row-system control circuit 51 is supplied to a row decoder 61. The row decoder 61 selects any of word lines WL included in a memory cell array 70. Within the memory cell array 70, plural word lines WL and plural bit lines BL cross each other, and memory cells MC are arranged at intersections of these word lines and bit lines (FIG. 2 shows only one word line WL, one bit line BL, and one memory cell MC). The bit lines BL are connected to corresponding sense amplifiers SA included in a sense circuit 63.

An output signal of the column-system control circuit 52 is supplied to the column decoder 62. The column decoder 62 selects any of sense amplifiers SA in the sense circuit 63. The sense amplifier SA selected by the column decoder 62 is connected to a data amplifier 64. In a read operation, the data amplifier 64 further amplifies read data amplified by the sense circuit 63, and supplies the amplified read data to the data input/output circuit 300 through a data bus BUS. On the other hand, in a write operation, the data amplifier 64 amplifies write data received from the data input/output circuit 300 through the data bus BUS, and supplies the amplified write data to the sense circuit 63. The data bus BUS transmits read data and write data each of which consists of a plurality of bits in parallel. The read/write control circuit 53 controls the data amplifier 64 and the data input/output circuit 300.

The data input/output terminal 14 is a terminal for outputting the read data DQ and inputting the write data DQ, and is connected to the data input/output circuit 300. The data input/output circuit 300 includes a data input circuit 310, and a data output circuit 320.

Figure 4:
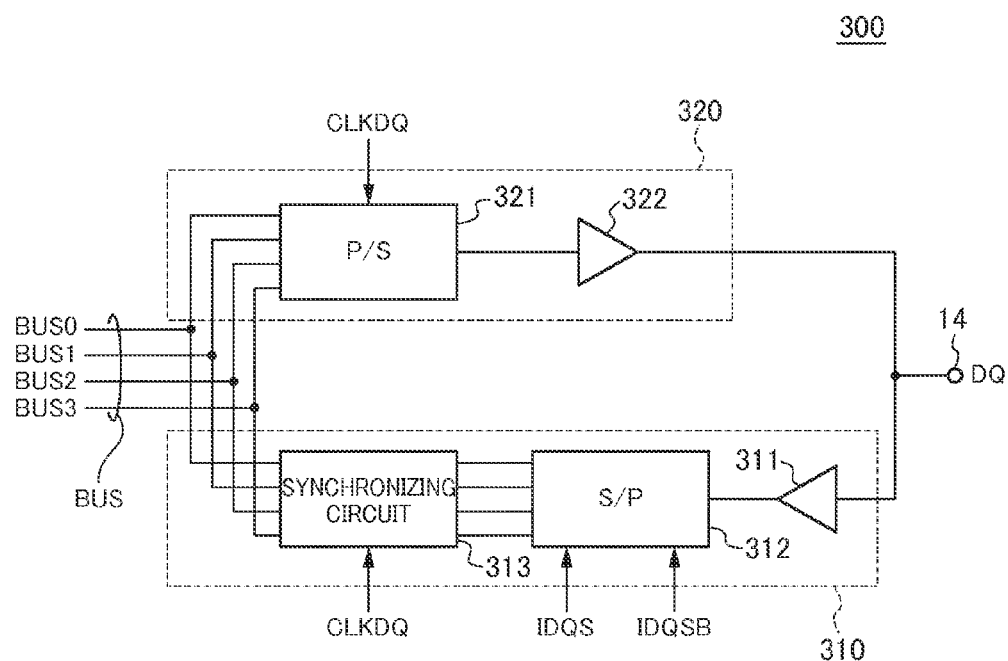
FIG. 4 is a block diagram indicative of a circuit configuration of a principal portion of a data input/output circuit shown in FIG. 2.

Turning to FIG. 4, the data input circuit 310 in the data input/output circuit 300 includes an input buffer 311, a serial-to-parallel conversion circuit 312, and a synchronizing circuit 313. The input buffer 311 receives the write data DQ that are supplied via the data input/output terminal 14. The output signal of the input buffer 311 is supplied to the serial-to-parallel conversion circuit 312. The serial-to-parallel conversion circuit 312 receives the write data DQ supplied in serial from the input buffer 311, and converts the write data DQ to a parallel form in synchronism with the internal data strobe signals IDQS and IDQSB. The write data DQ that have been converted to the parallel form are supplied to the synchronizing circuit 313. The synchronizing circuit 313 outputs the write data DQ in parallel to a data bus BUS in synchronism with the internal clock signal CLKDQ. Although not specifically restricted, the data bus BUS of the present embodiment is made up of four data buses BUS0 to BUS3. That is, the data input circuit 310 outputs the four-bit write data DQ that are supplied in serial, to the four data buses BUS0 to BUS3 in parallel. The circuit configurations of the serial-to-parallel conversion circuit 312 and the synchronizing circuit 313 will be detailed later.

The data output circuit 320 in the data input/output circuit 300 includes a parallel-to-serial conversion circuit 321 and an output buffer 322. The parallel-to-serial conversion circuit 321 converts the read data DQ that are supplied in parallel via the data bus BUS, to a serial form in synchronism with the internal clock signal CLKDQ. The read data DQ that have been converted to the serial form are supplied to the output buffer 322. The output buffer 322 receives the serial read data DQ, and outputs the read data DQ in serial to the outside via the data input/output terminal 14. Accordingly, in the present embodiment, the read data DQ that are supplied in parallel via the four data buses BUS0 to BUS3 are output in serial via the data input/output terminal 14.

Returning to FIG. 2, the data strobe terminals 15a and 15b are terminals for inputting and outputting the external data strobe signals DQS and DQSB, and are connected to the strobe circuit 80. As shown in FIG. 2, the strobe circuit 80 includes an internal data strobe signal generation circuit 81.

Figure 5:
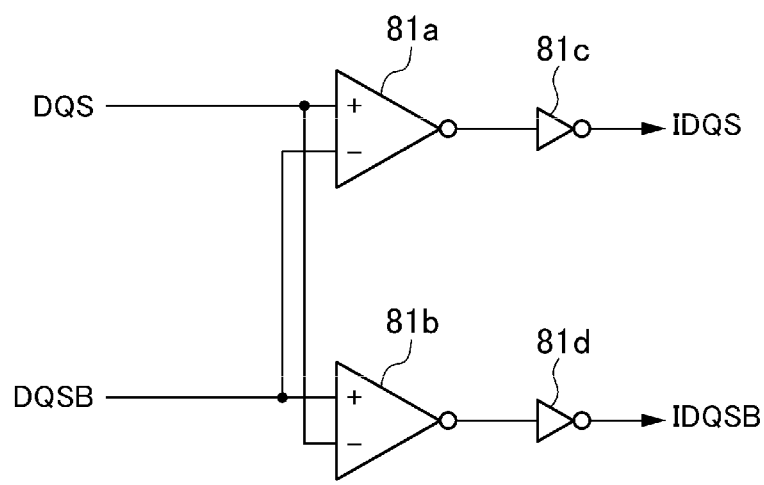
FIG. 5 is a circuit diagram indicative of an internal data strobe signal generation circuit shown in FIG. 2.
Figure 15:
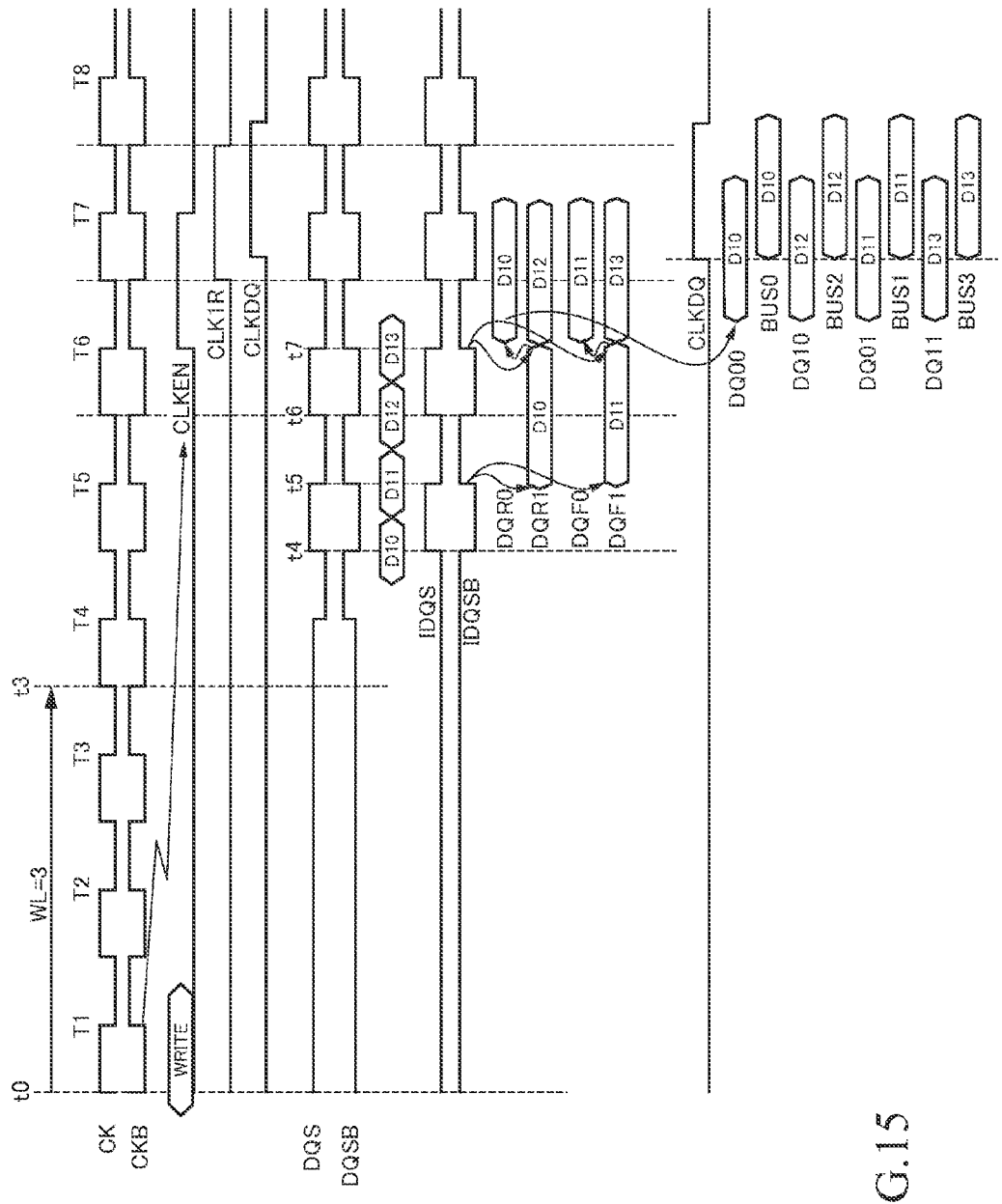
FIG. 15 is a timing chart indicative of a writing operation of the semiconductor device shown in FIG. 2.

Turning to FIG. 5, the internal data strobe signal generation circuit 81 has substantially the same circuit configuration as the clock input circuit 21 shown in FIG. 3. That is, the internal data strobe signal generation circuit 81 includes a pair of receiver circuits 81a and 81b that receives the external data strobe signals DQS and DQSB, and inverter circuits 81c and 81d that receive output signals of the receiver circuits 81a and 81b, respectively. The output signals of the inverter circuits 81c and 81d are used as the internal data strobe signals IDQS and DQSB, respectively. The receiver circuit 81a includes an non-inverting input node (+) supplied with the external data strobe signal DQS and an inverting input node (−) supplied with the external data strobe signal DQSB. The receiver circuit 81b includes an non-inverting input node (+) supplied with the external data strobe signal DQSB and an inverting input node (−) supplied with the external data strobe signal DQS. As a result, the waveform of the internal data strobe signals IDQS becomes substantially identical to the waveform of the external data strobe signal DQS. The waveform of the internal data strobe signal IDQSB becomes substantially identical to the waveform of the external data strobe signal DSQB. Therefore, according to the present embodiment, the internal data strobe signals IDQS and IDQSB can be regarded being the same as the external data strobe signals DSQ and DSQB. As shown in FIG. 15 which will be explained later, frequencies of the external data strobe signals DQS and DQSB, the internal data strobe signals IDQS and IDQSB, the external clock signals CK and CKB, and the internal clock signal PCLKR, PCLKF, and CLKDQ are equal to one another.

Figure 6:
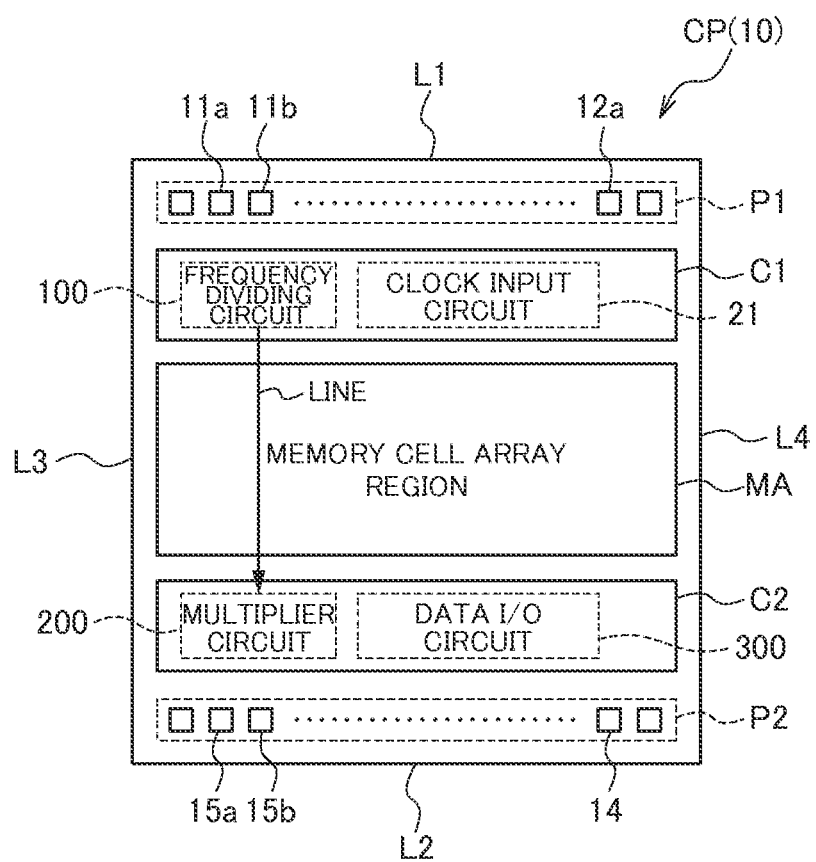
FIG. 6 is a plane view indicative of a layout of the semiconductor device shown in FIG. 2.

Turning to FIG. 6, the semiconductor device 10 according to the present embodiment is integrated on one silicon chip CP. A principal surface of the silicon chip CP is in a square shape, and has first and second sides L1 and L2 that are elongated in parallel to each other, and third and fourth sides L3 and L4 that are perpendicular to the sides L1 and L2 and elongated in parallel to each other. The semiconductor device 10 of the present embodiment includes a first pad region P1, which is provided along the first side L1, and a second pad region P2, which is provided along the second side L2. There are no pad regions along the third and fourth sides L3 and L4. The first and second pad regions P1 and P2 are regions where a plurality of external terminals are arranged. In the first pad region P1, the clock terminals 11a and 11b, the command address terminals 12a, the chip select terminal 12b, the clock enable terminal 12c, and the like are arranged. In the second pad region P2, the data input/output terminal 14, the data strobe terminals 15a and 15b, and the like are arranged.

The semiconductor device 10 of the present embodiment also includes a first peripheral circuit region C1 provided along the first pad region P1, a second peripheral circuit region C2 provided along the second pad region P2, and a memory cell array region MA sandwiched between the first and second peripheral circuit regions C1 and C2. In the first peripheral circuit region C1, peripheral circuits related to the external terminals arranged in the first pad region P1 are disposed. In the second peripheral circuit region C2, peripheral circuits related to the external terminals arranged in the second pad region P2 are disposed. For example, in the first peripheral circuit region C1, the clock input circuit 21, the frequency dividing circuit 100, and the like are disposed. In the second peripheral circuit region C2, the multiplier circuit 200, the data input/output circuit 300, and the like are disposed.

Given the layout described above, if the internal clock signals PCLKR and PCLKF are supplied directly to the second peripheral circuit region C2, the dullness of the waveform increases due to a relatively large parasitic capacitance of a long-distance clock line. The problem can be solved by several relay buffers that are interposed along the clock line. However, in this case, the problem arises that power-supply noise may be superimposed on the internal clock signals PCLKR and PCLKF because of the relay buffers. Therefore, the frequency of the internal clock signals PCLKR and PCLKF is divided by the frequency dividing circuit 100 to generate the frequency-divided clock signals CLK0R, CLK0F, CLK1R, and CLK1F that are then transmitted to the second peripheral circuit region C2 via the clock line LINE. The frequency-divided clock signals CLK0R, CLK0F, CLK1R, and CLK1F are multiplied by the multiplier circuit 200 that is placed in the second peripheral circuit region C2. As a result, the internal clock signal CLKDQ is regenerated so as to have the same frequency as the internal clock signals PCLKR and PCLKF. According to the above configuration, even though the clock line LINE is quite long, it is possible to improve the quality of the internal clock signal CLKDQ used in the data input/output circuit 300.

Figure 7:
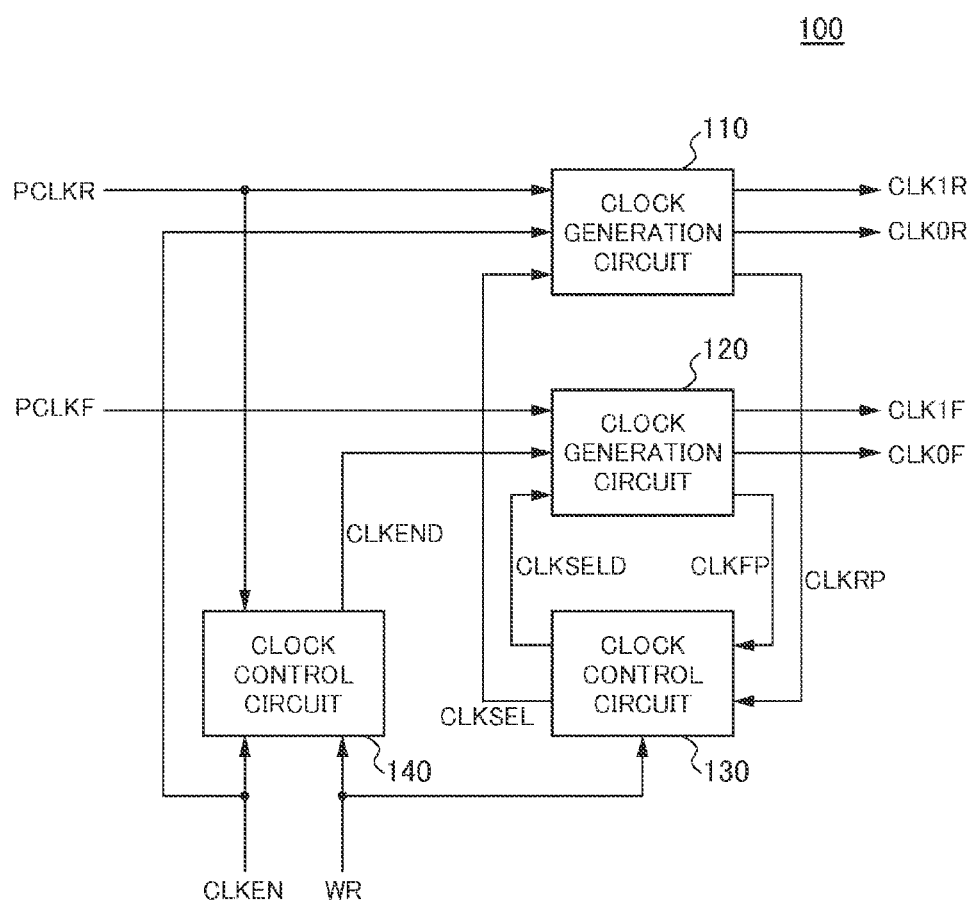
FIG. 7 is a block diagram indicative of a configuration of a frequency dividing circuit shown in FIG. 2.

Turning to FIG. 7, the frequency dividing circuit 100 includes clock generation circuits 110 and 120, and clock control circuits 130 and 140. The following describes each of the circuit blocks in detail.

Figure 8:
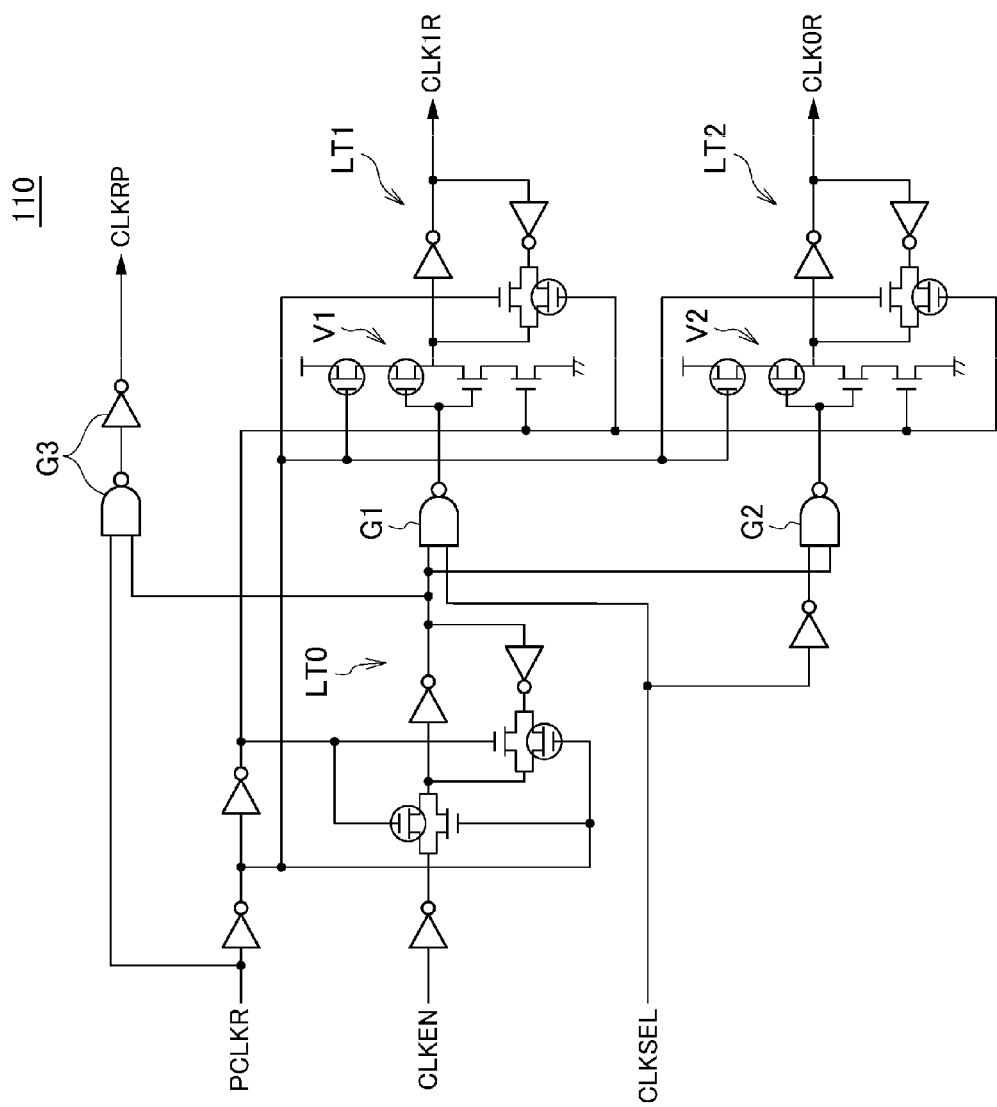
FIG. 8 is a circuit diagram indicative of a clock generation circuit 110 shown in FIG. 7.

Turning to FIG. 8, the clock generation circuit 110 includes three latch circuits LT0 to LT2. The latch circuit LT0 is a circuit that accepts an enable signal CLKEN during a period of time when the internal clock signal PCLKR is at a low level, and holds the enable signal CLKEN accepted over a period of time when the internal clock signal PCLKR is at a high level. The enable signal CLKEN is a signal that is supplied from the command decoder 32 shown in FIG. 2. The signal latched by the latch circuit LT0 is supplied to the latch circuit LT1 via a NAND gate circuit G1 and a tri-state inverter circuit V1, as well as to the latch circuit LT2 via a NAND gate circuit G2 and a tri-state inverter circuit V2. One of the NAND gate circuits G1 and G2 is selected based on a logic level of a clock selection signal CLKSEL. The clock selection signal CLKSEL is a signal that is supplied from the clock control circuit 130 shown in FIG. 7.

The tri-state inverter circuits V1 and V2 both are activated during a period of time when the internal clock signal PCLKR is at a high level. The latch circuits LT1 and LT2 accept the output signals of the NAND gate circuits G1 and G2, respectively, and hold the output signals accepted over a period of time when the internal clock signal PCLKR is at a low level. The signal latched by the latch circuit T1 is used as the frequency-divided clock signal CLK1R, and the signal latched by the latch circuit T2 as the frequency-divided clock signal CLK0R.

The output signal of the latch circuit LT0 and the internal clock signal PCLKR are supplied to an AND gate circuit G3. A clock control signal CLKRP that is output from the AND gate circuit G3 is supplied to the clock control circuit 130 as shown in FIG. 7.

Figure 9:
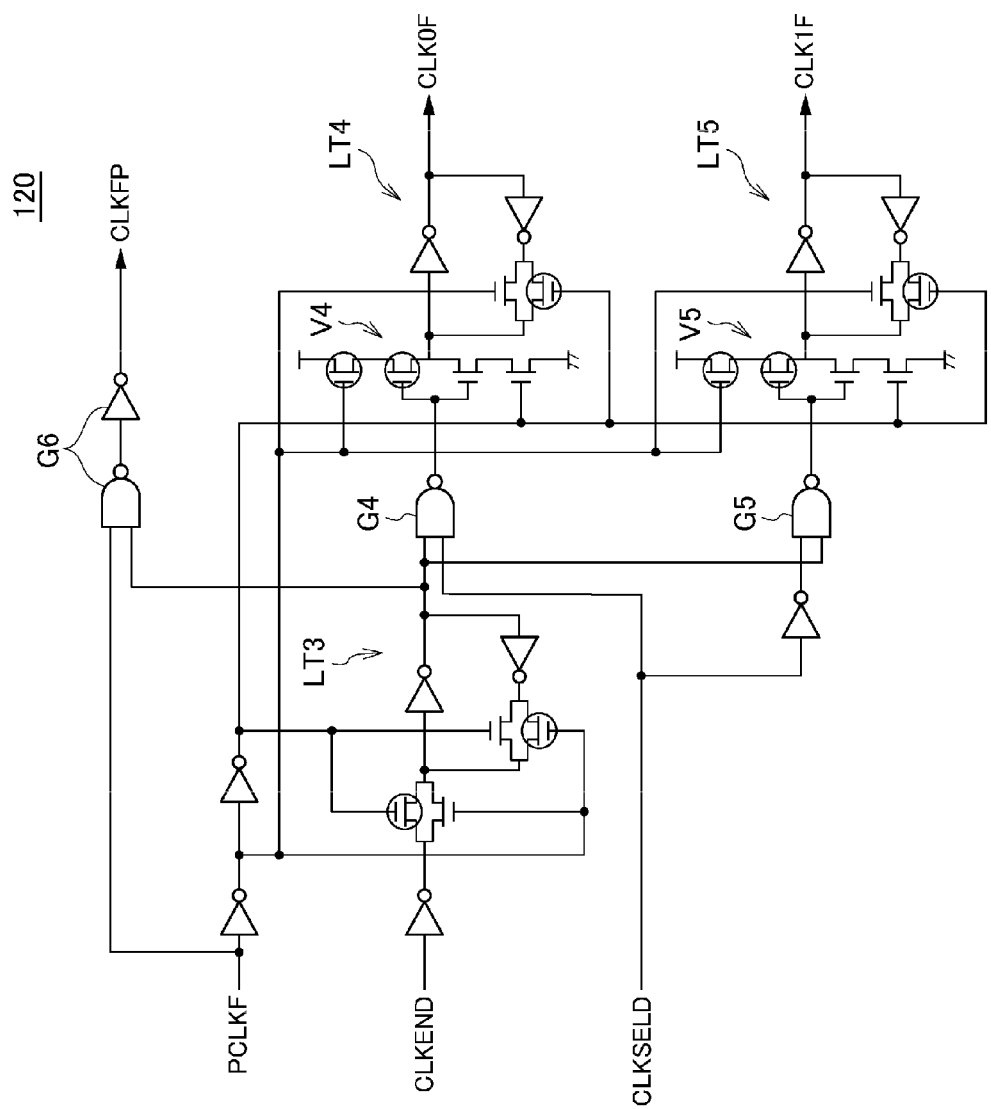
FIG. 9 is a circuit diagram indicative of a clock generation circuit 120 shown in FIG. 7.

Turning to in FIG. 9, the clock generation circuit 120 has the same circuit configuration as the clock generation circuit 110 shown in FIG. 8. More specifically, the clock generation circuit 120 includes three latch circuits LT3 to LT5. The latch circuit LT3 is a circuit that accepts an enable signal CLKEND during a period of time when the internal clock signal PCLKF is at a low level, and holds the enable signal CLKEND accepted over a period of time when the internal clock signal PCLKF is at a high level. The enable signal CLKEND is a signal that is supplied from the clock control circuit 140 shown in FIG. 7. The signal latched by the latch circuit LT3 is supplied to the latch circuit LT4 via a NAND gate circuit G4 and a tri-state inverter circuit V4, as well as to the latch circuit LT5 via a NAND gate circuit G5 and a tri-state inverter circuit V5. One of the NAND gate circuits G4 and G5 is selected based on a logic level of a clock selection signal CLKSELD. The clock selection signal CLKSELD is a signal that is supplied from the clock control circuit 130 shown in FIG. 7.

The tri-state inverter circuits V4 and V5 both are activated during a period of time when the internal clock signal PCLKF is at a high level. The latch circuits LT4 and LT5 accept the output signals of the NAND gate circuits G4 and G5, respectively, and hold the output signals accepted over a period of time when the internal clock signal PCLKF is at a low level. The signal latched by the latch circuit T4 is used as the frequency-divided clock signal CLK0F, and the signal latched by the latch circuit T5 as the frequency-divided clock signal CLK1F.

The output signal of the latch circuit LT3 and the internal clock signal PCLKF are supplied to an AND gate circuit G6. A clock control signal CLKFP that is output from the AND gate circuit G6 is supplied to the clock control circuit 130 as shown in FIG. 7.

Figure 10:
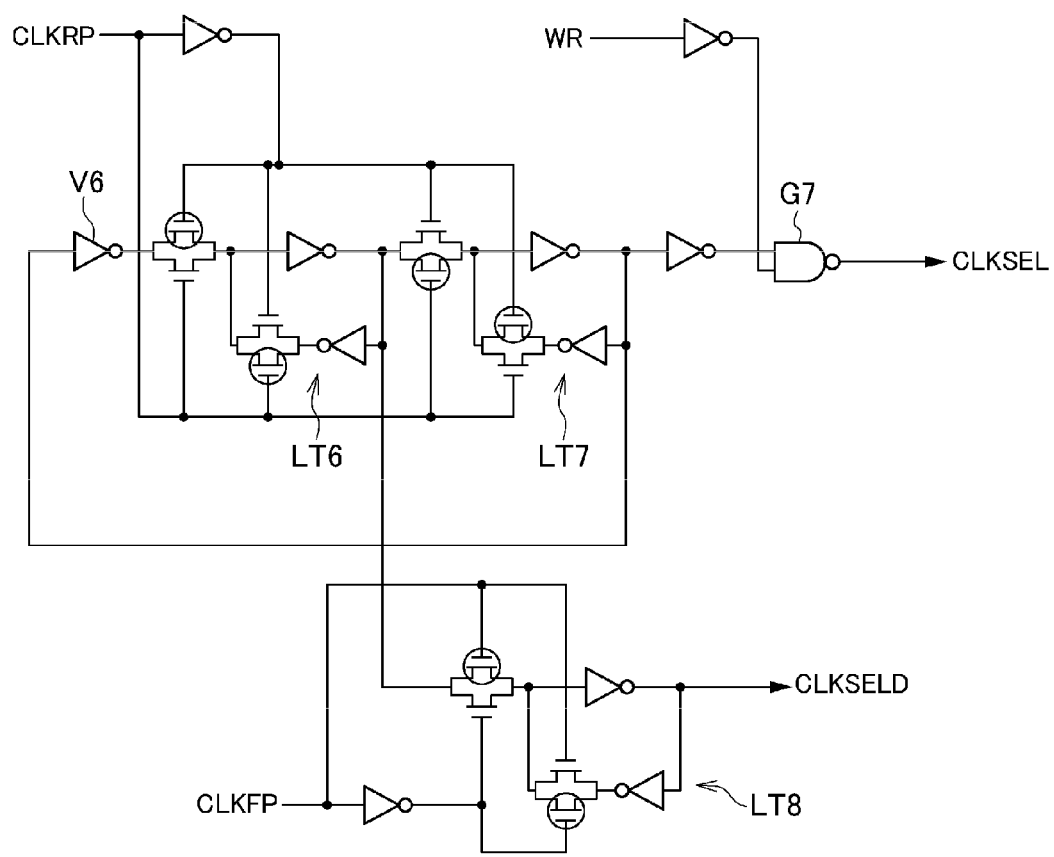
FIG. 10 is a circuit diagram indicative of a clock control circuit 130 shown in FIG. 7.

Turning to FIG. 10, the clock control circuit 130 includes latch circuits LT6 and LT7, which are circularly connected via an inverter circuit V6. The latch circuits LT6 and LT7 operate in synchronization with the clock control signal CLKRP. Accordingly, the signal output from the latch circuit LT7 is inverted every two clock cycles of the clock control signal CLKRP. The signal output from the latch circuit LT7 passes through a NAND gate circuit G7, and is used as the clock selection signal CLKSEL. As shown in FIG. 10, to the other input node of the NAND gate circuit G7, an inverted write signal WR is supplied. The write signal WR is a signal that is supplied from the command decoder 32 shown in FIG. 2; during the writing operation, the write signal WR is activated to a high level. Accordingly, during the writing operation, the logic level of the clock selection signal CLKSEL is fixed to a high level.

The output of the latch circuit LT6 is also supplied to a latch circuit LT8. The latch circuit LT8 is a circuit that performs a latch operation in synchronization with the clock control signal CLKFP. The output signal of the latch circuit LT8 is used as the clock selection signal CLKSELD.

Figure 11:
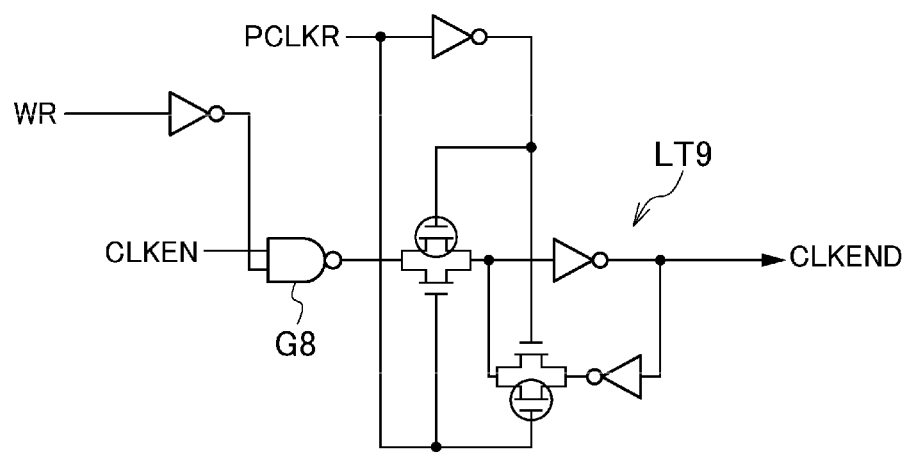
FIG. 11 is a circuit diagram indicative of a clock control circuit 140 shown in FIG. 7.

Turning to FIG. 11, the clock control circuit 140 includes a latch circuit LT9. To the latch circuit LT9, the output signal of a NAND gate circuit G8 is supplied. To the NAND gate circuit G8, an enable signal CLKEN and an inverted write signal WR are supplied. Accordingly, during the writing operation, the output signal of the NAND gate circuit G8 is fixed to a high level. The latch circuit LT9 operates in synchronization with the internal clock signal PCLKR; the output signal thereof is used as the enable signal CLKEND.

According to the above configuration, during the reading operation, or during the period when the enable signal CLKEN supplied from the command decoder 32 is at a high level, and the write signal WR is at a low level, the frequency-divided clock signals CLK0R, CLK0F, CLK1R, and CLK1F, which are different in phase from one another, are generated. During the writing operation, or during the period when the enable signal CLKEN supplied from the command decoder 32 and the write signal WR are both at a high level, only the frequency-divided clock signal CLK1R is generated. The other frequency-divided clock signals CLK0F, CLK0R, and CLK1F are not generated, and are fixed to a high level.

Figure 12:
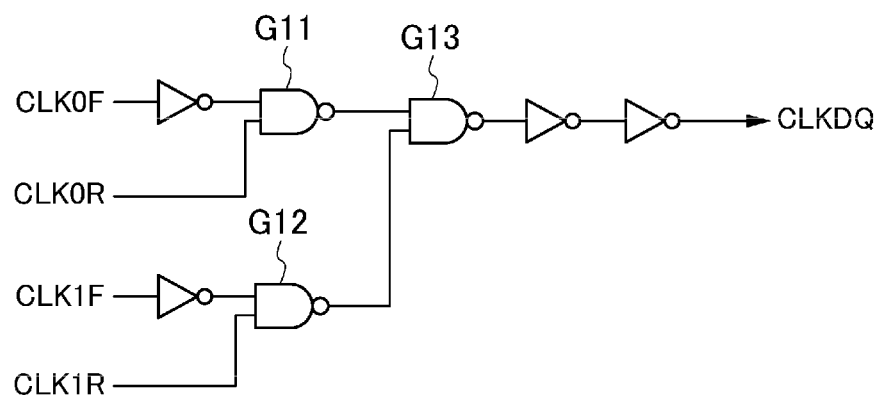
FIG. 12 is a circuit diagram indicative of a multiplier circuit shown in FIG. 2.

Turning to FIG. 12, the multiplier circuit 200 includes NAND gate circuits G11 to G13. The NAND gate circuit G11 is a circuit that receives the frequency-divided clock signal CLK0R and the inverted frequency-divided clock signal CLK0F; the output signal thereof is supplied to one input node of the NAND gate circuit G13. The NAND gate circuit G12 is a circuit that receives the frequency-divided clock signal CLK1R and the inverted frequency-divided clock signal CLK1F; the output signal thereof is supplied to the other input node of the NAND gate circuit G13. The output signal of the NAND gate circuit G13 is used as the internal clock signal CLKDQ.

According to the above configuration, during the period when the frequency-divided clock signals CLK0R, CLK0F, CLK1R, and CLK1F, which are different in phase from one another, are generated, or during the reading operation, the waveform of the internal clock signal CLKDQ is substantially identical to the waveform of the internal clock signal PCLKR. During the period when only the frequency-divided clock signal CLK1R is generated, or during the writing operation, the waveform of the internal clock signal CLKDQ is substantially identical to the waveform of the internal clock signal CLK1R, which means that, during the writing operation, the frequency-divided clock signal CLK1R can be regarded as being the same as the internal clock signal CLKDQ.

Incidentally, the semiconductor device 10 of the present embodiment is a DRAM of a low-power consumption type with no DLL circuit. Therefore, the frequency-divided clock signals CLK0R, CLK0F, CLK1R, and CLK1F, and the internal clock signal CLKDQ are not phase-controlled with respect to the external clock signals CK and CKB. Even if the DLL circuit is provided, there is little need to divide the frequency of the internal clock signals PCLKR and PCLKF and multiply them to regenerate the internal clock signal CLKDQ.

Figure 13:
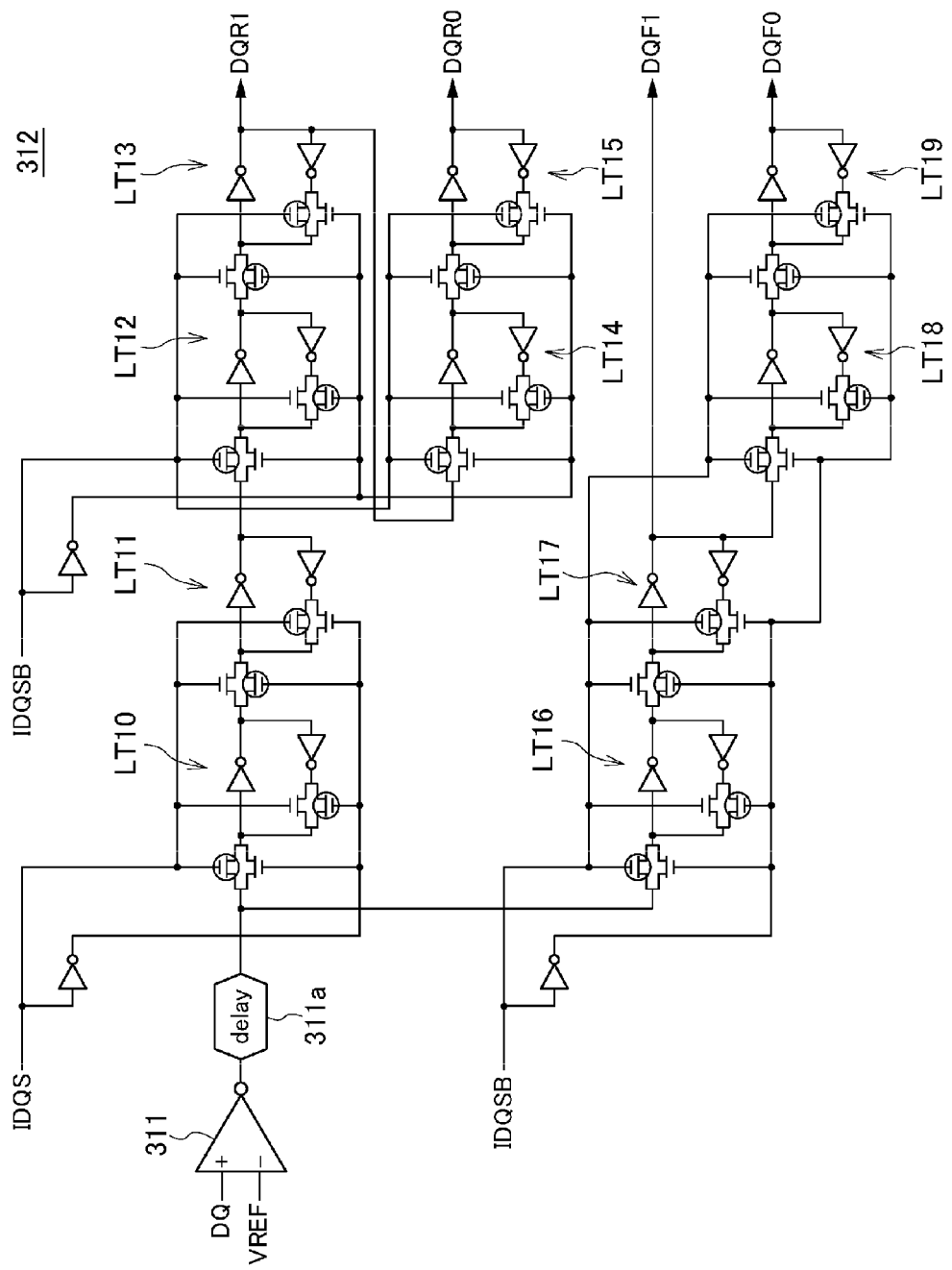
FIG. 13 is a circuit diagram indicative of an input buffer and a serial-to-parallel conversion circuit in a data input circuit shown in FIG. 4.

Turning to FIG. 13, the input buffer 311 includes a differential circuit in which the write data DQ are supplied to a non-inverting input node (+), and reference voltage VREF to an inverting input node (−). The output signal of the input buffer 311 is supplied to the serial-to-parallel conversion circuit 312 via a delay circuit 311a that is designed to adjust timing. The serial-to-parallel conversion circuit 312 includes latch circuits LT10 to LT15, which are connected in series; and latch circuits LT16 to LT19, which are also connected in series.

Among the latch circuits LT10 to LT19, the latch circuit LT10 accepts an input signal during a period of time when the internal data strobe signal IDQS is at a low level, and holds the input signal accepted over a period of time when the internal data strobe signal IDQS is at a high level. The latch circuit LT11 accepts an input signal during a period of time when the internal data strobe signal IDQS is at a high level, and holds the input signal accepted over a period of time when the internal data strobe signal IDQS is at a low level. Each of the latch circuits LT12, LT14, LT16, and LT18 accepts an input signal during a period of time when the internal data strobe signal IDQSB is at a low level, and holds the input signal accepted over a period of time when the internal data strobe signal IDQSB is at a high level. Each of the latch circuits LT13, LT15, LT17, and LT19 accepts an input signal during a period of time when the internal data strobe signal IDQSB is at a high level, and holds the input signal accepted over a period of time when the internal data strobe signal IDQSB is at a low level. From the latch circuits LT13, LT15, LT17, and LT19, the output signals DQR1, DQR0, DQF1, and DQF0 are taken out, respectively.

According to the above configuration, if the first and subsequent bits of the four-bit write data DQ that are input in a serial form are sequentially represented by D10 to D13, respectively, the signals that are output from the serial-to-parallel conversion circuit 312 two clock cycles after the inputting of the first bit D10 are: the output signal DQR0, which is equivalent to the bit D10; the output signal DQF0, which is equivalent to the bit D11; the output signal DQR1, which is equivalent to the bit D12; and the output signal DQF1, which is equivalent to the bit D13. That is, the 4:1 serial-to-parallel conversion is performed at two clock cycles. For the conversion operation, the internal data strobe signals IDQS and IDQSB are used, while the other internal clock signals are not used.

Figure 14:
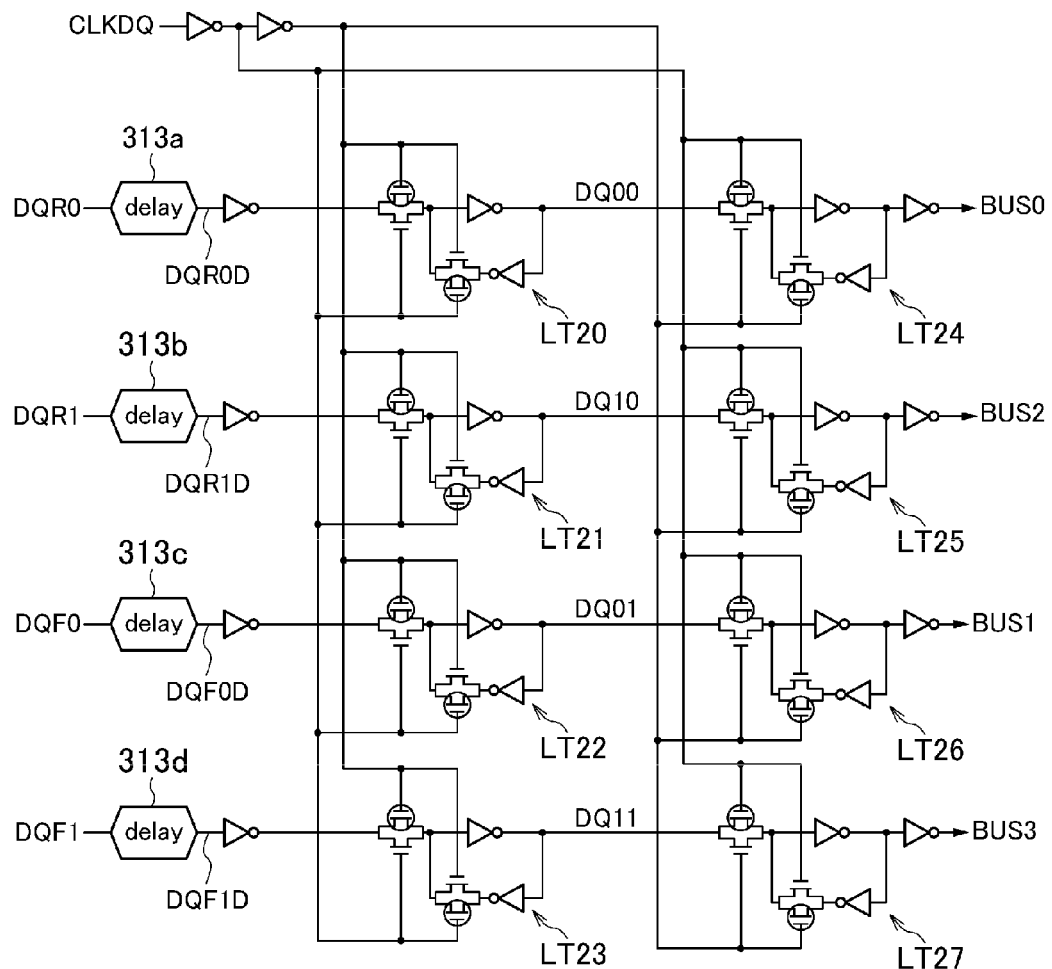
FIG. 14 is a circuit diagram indicative of a synchronizing circuit in the data input circuit shown in FIG. 4.

Turning to FIG. 14, the synchronizing circuit 313 includes delay circuits 313a to 313d, which are designed to adjust the timing of the output signals DQR0, DQR1, DQF0, and DQF1 supplied from the serial-to-parallel conversion circuit 312; and latch circuits LT20 to LT27. In FIG. 14, the output signals whose timings have been adjusted by the delay circuits 313a to 313d are represented by DQR0D, DQR1D, DQF0D, and DQF1D. The output signal DQR0D is supplied to a series circuit that includes the latch circuits LT20 and LT24. The output signal DQR1D is supplied to a series circuit that includes the latch circuits LT21 and LT25. The output signal DQF0D is supplied to a series circuit that includes the latch circuits LT22 and LT26. The output signal DQF1D is supplied to a series circuit that includes the latch circuits LT23 and LT27.

Each of the latch circuits LT20 to LT23 accepts an input signal during a period of time when the internal clock signal CLKDQ is at a low level, and holds the input signal accepted over a period of time when the internal clock signal CLKDQ is at a high level. Each of the latch circuits LT24 to LT27 accepts an input signal during a period of time when the internal clock signal CLKDQ is at a high level, and holds the input signal accepted over a period of time when the internal clock signal CLKDQ is at a low level. The output signals of the latch circuits LT24 to LT27 are supplied to the corresponding data buses BUS0 to BUS3.

According to the above configuration, during a period of time when the internal clock signal CLKDQ is at a low level, the parallel output signals DQR0, DQR1, DQF0, and DQF1 supplied from the serial-to-parallel conversion circuit 312 are transferred from the latch circuits LT20 to LT23 to the latch circuits LT24 to LT27. After the internal clock signal CLKDQ is changed to a high level, the signals are output to the data buses BUS0 to BUS3.

Turning to FIG. 15, in the example, at time t0, a write command WRITE is issued. In the present example, write latency is set to three clock cycles. Accordingly, at time t3, which is three clock cycles after time t0, the clocking of the external data strobe signals DQS and DQSB starts. At time t4, which is four clock cycles later, the process of inputting the write data DQ in burst mode starts. As shown in FIG. 15, in synchronization with the rising and falling edges of the external clock signal CK, the write data DQ are input in burst mode in order of the bits D10 to D13. In synchronization with the input timing of the write data DQ, the external data strobe signals DQS and DQSB are also input.

More specifically, in synchronization with a rising edge of the external data strobe signal DQS, or at time t4, the bit D10 is input. In synchronization with a rising edge of the external data strobe signal DQSB, or at time t5, the bit D11 is input. In synchronization with the next rising edge of the external data strobe signal DQS, or at time t6, the bit D12 is input. In synchronization with the next rising edge of the external data strobe signal DQSB, or at time t7, the bit D13 is input.

At time t5, the bits D10 and D11 are output from the serial-to-parallel conversion circuit 312 as output signals DQR1 and DQF1, respectively. At time t7, the bits D10 to D13 are taken out from the serial-to-parallel conversion circuit 312 as output signals DQR0, DQF0, DQR1, and DQF1, respectively. In this manner, the bits D10 to D13, which are the four-bit write data input in a serial form, are converted into a parallel form with the use of the external data strobe signals DQS and DQSB.

The output signals DQR0, DQF0, DQR1, and DQF1 that have been converted into a parallel form are input into the synchronizing circuit 313, and are output to the data buses BUS0 to BUS3 in synchronization with a rising edge of the internal clock signal CLKDQ. After that, the write data on the data buses BUS0 to BUS3 are written into a predetermined memory cell MC that the memory cell array 70 contains.

In this case, during the writing operation, the signal that is output from the frequency dividing circuit 100 is only the frequency-divided clock signal CLK1R; the other frequency-divided clock signals CLK0F, CLK0R, and CLK1F are fixed to a high level. Therefore, during the writing operation, the waveform of the internal clock signal CLKDQ is substantially identical to the waveform of the frequency-divided clock signal CLK1R. That is, in the internal clock signal CLKDQ, active edges corresponding to the other frequency-divided clock signals CLK0F, CLK0R, and CLK1F do not appear. However, in the semiconductor device 10 of the present embodiment, with the use of the external data strobe signals DQS and DQSB, the serial-to-parallel conversion of the write data DQ has been completed. Therefore, the timing signal required in this case is the timing signal that is used for synchronously outputting data to the data buses BUS0 to BUS3, i.e. only the frequency-divided clock signal CLK1R. Accordingly, during the writing operation, even if the other frequency-divided clock signals CLK0F, CLK0R, and CLK1F are stopped, the writing operation can be performed appropriately.

As described above, in the semiconductor device 10 of the present embodiment, during the writing operation, the frequency-divided clock signals CLK0F, CLK0R, and CLK1F are stopped. Therefore, power consumption can be reduced.

The detailed operation of the data output circuit 320 during the reading operation is not shown in the diagram. However, the clocking of all the frequency-divided clock signals CLK1R, CLK0F, CLK0R, and CLK1F is performed by the frequency dividing circuit 100. Therefore, the waveform of the internal clock signal CLKDQ is substantially identical to the waveform of the internal clock signal PCLKR whose frequency is not divided yet. Thus, the parallel-to-serial conversion circuit 321 shown in FIG. 4 is able to convert the four-bit read data DQ, which are supplied in a parallel form from the data buses BUS0 to BUS3, into a serial form in synchronization with the internal clock signal CLKDQ.

Next, a circuit configuration of prototype examples will be explained with reference to FIGS. 16 and 17.

Figure 16:
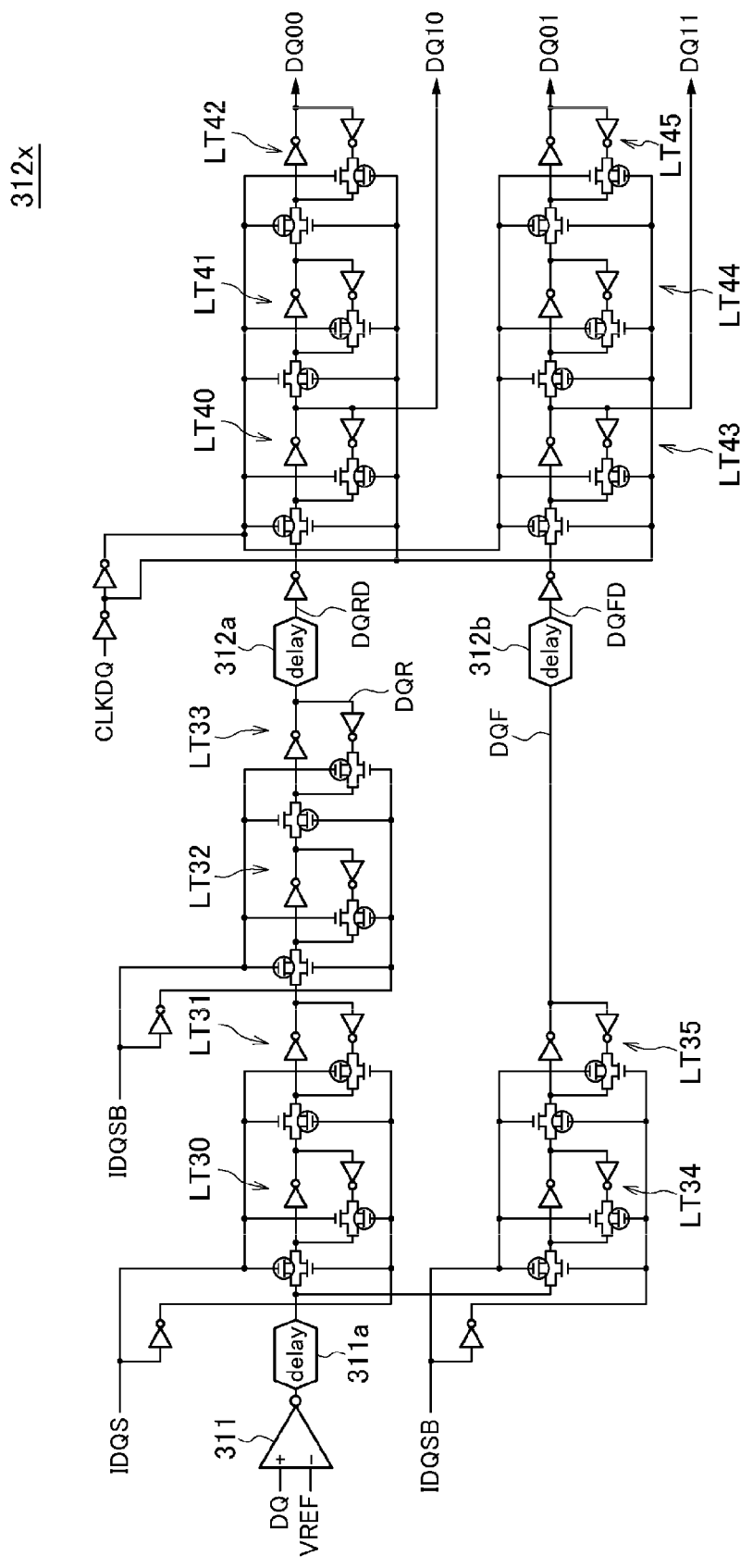
FIG. 16 is a circuit diagram indicative of a serial-to-parallel conversion circuit 312x that the inventor has conceived as a prototype in the course of making the present invention.

Turning to FIG. 16, the serial-to-parallel conversion circuit 312*x* of the prototype includes latch circuits LT30 to LT33, which are connected in series; and latch circuits LT34 and LT35, which are also connected in series. The latch circuit LT30 accepts an input signal during a period of time when the internal data strobe signal IDQS is at a low level, and holds the input signal accepted over a period of time when the internal data strobe signal IDQS is at a high level. The latch circuit LT31 accepts an input signal during a period of time when the internal data strobe signal IDQS is at a high level, and holds the input signal accepted over a period of time when the internal data strobe signal IDQS is at a low level. Each of the latch circuits LT32 and 34 accepts an input signal during a period of time when the internal data strobe signal IDQSB is at a low level, and holds the input signal accepted over a period of time when the internal data strobe signal IDQSB is at a high level. Each of the latch circuits LT33 and LT35 accepts an input signal during a period of time when the internal data strobe signal IDQSB is at a high level, and holds the input signal accepted over a period of time when the internal data strobe signal IDQSB is at a low level. From the latch circuits LT33 and LT35, the output signals DQR and DQF are taken out.

In that manner, the 4:2 serial-to-parallel conversion of the four-bit write data DQ that are input in a serial form are performed by the latch circuits LT30 to LT35. The output signal DQR output from the latch circuit LT33 is supplied to latch circuits LT40 to LT42, which are connected in series, via a timing-adjusting delay circuit 312*a*. The output signal DQF output from the latch circuit LT35 is supplied to latch circuits LT43 to LT45, which are connected in series, via a timing-adjusting delay circuit 312*b*.

Each of the latch circuits LT40, LT42, LT43, and LT45 accepts an input signal during a period of time when the internal clock signal CLKDQ is at a low level, and holds the input signal accepted over a period of time when the internal clock signal CLKDQ is at a high level. Each of the latch circuits LT41 and LT44 accepts an input signal during a period of time when the internal clock signal CLKDQ is at a high level, and holds the input signal accepted over a period of time when the internal clock signal CLKDQ is at a low level. From the latch circuits LT42, LT40, LT45, and LT43, the output signals DQ00, DQ10, DQ01, and DQ11 are taken out, respectively.

Figure 17:
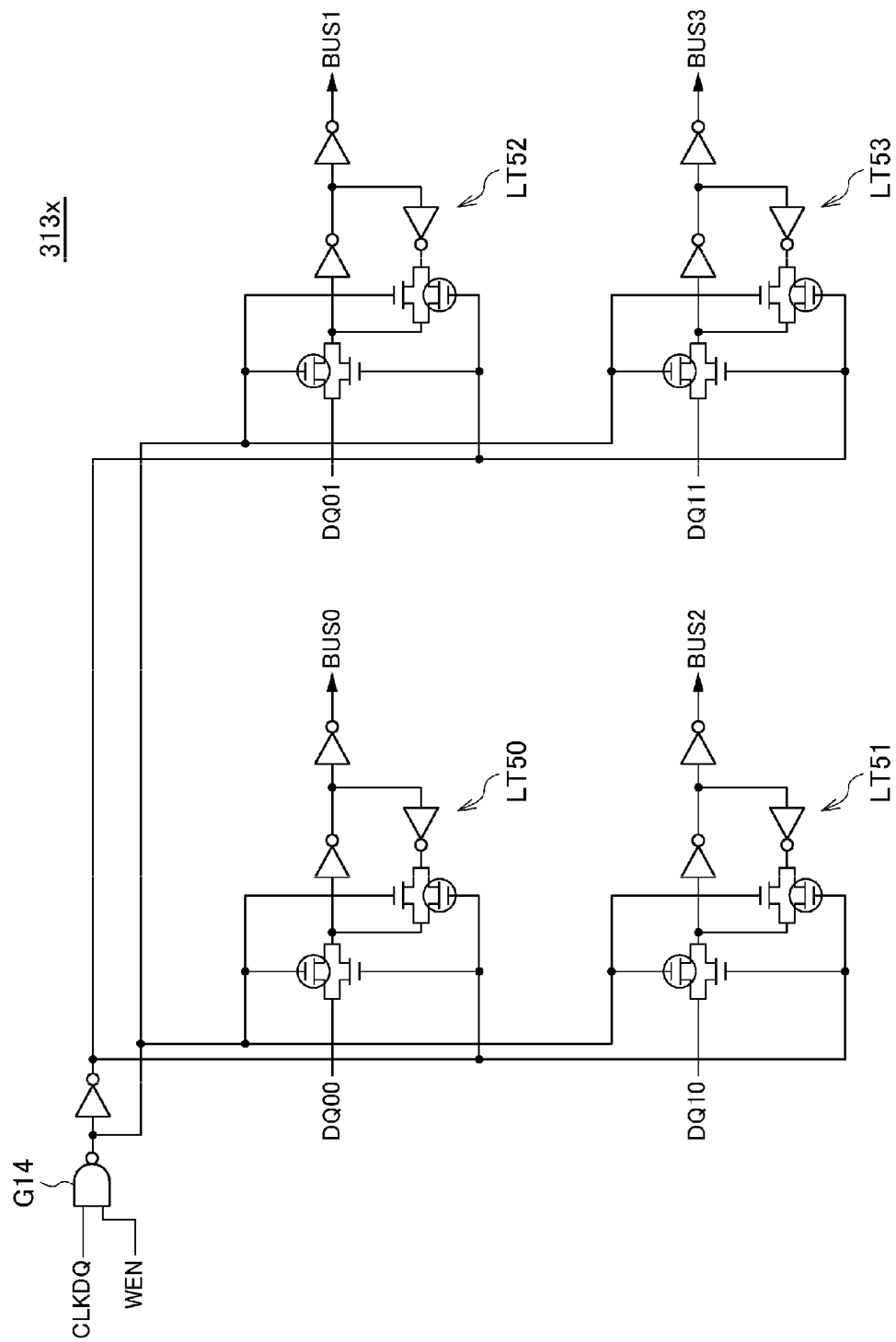
FIG. 17 is a circuit diagram indicative of a synchronizing circuit 313x that the inventor has conceived as a prototype in the course of making the present invention.

Turning to FIG. 17, the synchronizing circuit 313*x* includes a NAND gate circuit G14, which receives the internal clock signal CLKDQ and a write enable signal WEN; and latch circuits LT50 to LT53, which receive the output signals DQ00, DQ10, DQ01, and DQ11 supplied form the serial-to-parallel conversion circuit 312*x*. The write enable signal WEN is a signal that becomes activated to a high level during the writing operation. Each of the latch circuits LT50 to LT53 accepts an input signal during a period of time when the output signal of the NAND gate circuit G14 is at a low level, and holds the input signal accepted over a period of time when the output signal of the NAND gate circuit G14 is at a high level. The output signals of the latch circuits LT50 to LT53 are supplied to the corresponding data buses BUS0 to BUS3.

According to the above configuration, the output signals DQ00, DQ10, DQ01, and DQ11 that are in a parallel form and supplied from the serial-to-parallel conversion circuit 312*x* are output to the data buses BUS0 to BUS3 in synchronization with a rising edge of the internal clock signal CLKDQ.

Incidentally, if the circuits shown in FIGS. 16 and 17 are used, four phases of frequency-divided clock signal, CLK0R, CLK0F, CLK1R, and CLK1F, are required even for the writing operation. Therefore, the frequency dividing circuit 100 operates in the same way during the reading and writing operations.

Figure 18:
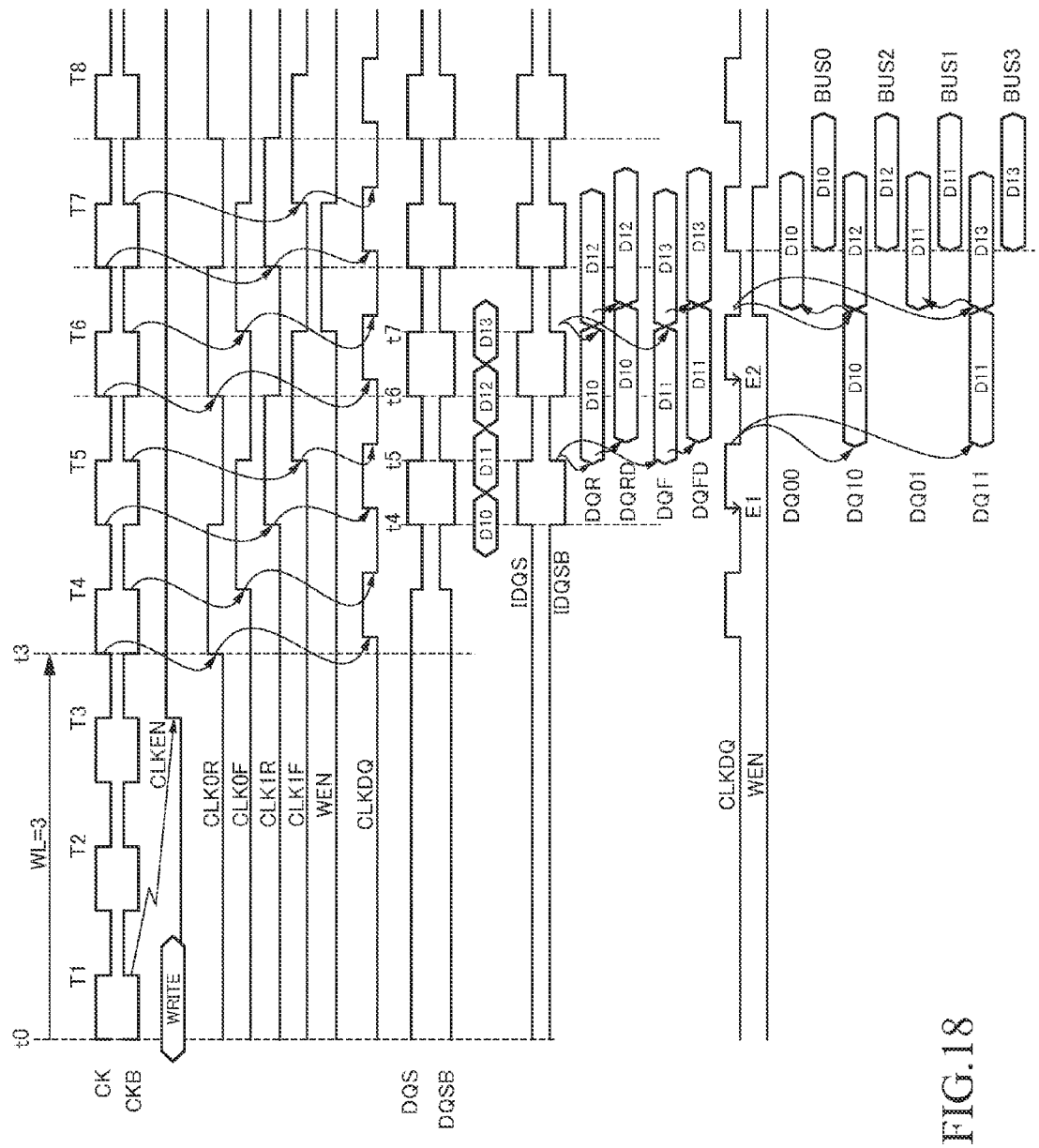
FIG. 18 is a timing chart indicative of the operation of the circuits shown in FIGS. 16 and 17.

Turning to FIG. 18, in this example, as in the example shown in FIG. 15, at time t0, a write command WRITE is issued. The write latency is set to three clock cycles. Accordingly, at time t3, which is three clock cycles after time t0, the clocking of the external data strobe signals DQS and DQSB starts. At time t4, which is four clock cycles after time t0, the process of inputting the write data DQ in burst mode starts.

At time t5, the bits D10 and D11 are output from the serial-to-parallel conversion circuit 312*x* as output signals DQR and DQF, respectively. At time t7, the bits D12 and D13 are output from the serial-to-parallel conversion circuit 312*x* as output signals DQR and DQF, respectively. In this manner, the bits D10 to D13, which are the four-bit write data input in a serial form, are converted into two-bit parallel signals with the use of the external data strobe signals DQS and DQSB.

The output signals DQR and DQF that have been converted into a two-bit parallel form are latched by the latch circuits LT40 to LT45 that the serial-to-parallel conversion circuit 312*x* contains in synchronization with the internal clock signal CLKDQ. More specifically, in synchronization with a falling edge E1 of the internal clock signal CLKDQ, the bits D10 and D11 are output from the serial-to-parallel conversion circuit 312*x* as output signals DQ10 and DQ11, respectively. Then, in synchronization with the next falling edge E2 of the internal clock signal CLKDQ, the bits D10 and D13 are taken out from the serial-to-parallel conversion circuit 312*x* as output signals DQ00, DQ01, DQ10, and DQ11, respectively. In this manner, the serial conversion of the bits D10 to D13, which are the four-bit write data, is completed.

Then, the output signals DQ00, DQ01, DQ10, and DQ11 are input into the synchronizing circuit 313x, and are output to the data buses BUS0 to BUS3 in synchronization with a rising edge of the internal clock signal CLKDQ. After that, the write data on the data buses BUS0 to BUS3 are written into a predetermined memory cell MC that the memory cell array 70 contains.

As described above, in the present example, the internal clock signal CLKDQ is used in the serial-to-parallel conversion of the write data DQ. Therefore, even during the writing operation, the internal clock signal CLKDQ that has the same frequency as the internal clock signal PCLKR is required. As a result, the frequency dividing circuit 100 needs to supply the four phases of frequency-divided clock signal, CLK1R, CLK0F, CLK0R, and CLK1F, to the multiplier circuit 200 not only during the reading operation but also during the writing operation. If the clock line LINE that is used to transmit the frequency-divided clock signals CLK1R, CLK0F, CLK0R, and CLK1F is long, power consumption increases during the writing operation.

On the other hand, the semiconductor device 10 of the present embodiment described above is able to stop the frequency-divided clock signals CLK0F, CLK0R, and CLK1F during the writing operation, leading to a reduction in power consumption.

According to the embodiment of the present invention, during a writing operation, it is not necessary to transmit all of a plurality of second clock signal, which are different in phase from one another. Therefore, power consumption can be reduced during the writing operation.

It is apparent that the present invention is not limited to the above embodiments, but may be modified and changed without departing from the scope and spirit of the invention.

Volatile memories, non-volatile memories, or mixtures of them can be applied to the memory cells of the present invention.

The technical concept of the present invention can be applied to a semiconductor device having a signal transmission circuit. The forms of the circuits in the circuit blocks disclosed in the drawings and other circuits for generating the control signals are not limited to the circuit forms disclosed in the embodiments.

The technical concept of the present invention can be applied to a general semiconductor device such as a CPU (Central Processing Unit), an MCU (Micro Control Unit), a DSP (Digital Signal Processor), an ASIC (Application Specific Integrated Circuit), an ASSP (Application Specific Standard Product), and a memory. An SOC (System on Chip), an MCP (Multi Chip Package), and a POP (Package on Package) and so on are pointed to as examples of types of semiconductor device to which the present invention is applied. The present invention can be applied to the semiconductor device that has these arbitrary product form and package form.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

In addition, a PMOS transistor (P-channel MOS transistor) is a representative example of a first conductive transistor, and an NMOS transistor (N-channel MOS transistor) is a representative example of a second conductive transistor.

Many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention.

What is claimed is:

1. A semiconductor device comprising:
   first and second opposing sides elongated in a first direction, the first and second sides being parallel to each other;
   a first peripheral circuit region located closer to the first side than the second side, wherein the first peripheral circuit region comprises clock input circuitry configured to receive an external clock signal and generate a first clock signal and a frequency dividing circuit configured to generate one or more frequency-divided second clock signals by dividing a frequency of the first clock signal;
   a second peripheral circuit region located closer to the second side than the first side, wherein the second peripheral circuit region comprises a multiplier circuit configured to receive the one or more second clock signals and generate a third clock signal; and
   at least one clock line extending from the first peripheral circuit region to the second peripheral circuit region, wherein at least one of the second clock signals is transmitted from the frequency dividing circuit to the multiplier circuit by the at least one clock line.

2. The semiconductor device of claim 1, comprising a memory array having a plurality of memory cells, wherein the memory array is arranged between the first peripheral circuit region and the second peripheral circuit region.

3. The semiconductor device of claim 2, wherein the at least one clock line extends across the memory array.

4. The semiconductor device of claim 1, wherein the second peripheral circuit region comprises a data input/output circuit configured to transfer data in synchronization with the third clock signal.

5. The semiconductor device of claim 4, comprising:
   a first pad area located closer to the first side than the second side, the first pad area comprising terminals for receiving the external clock signal and a command signal; and
   a second pad area located closer to the second side than the first side, the second pad area comprising terminals for data and a data strobe signal.

6. The semiconductor device of claim 5, wherein the first pad area is arranged between the first peripheral circuit region and the first side.

7. The semiconductor device of claim 5, wherein the second pad area is arranged between the second peripheral circuit region and the second side.

8. The semiconductor device of claim 5, wherein the frequency dividing circuit generates, when the command signal indicates a first command, a plurality of second clock signals that are different in phase from each other, and the third clock signal generated by the multiplier circuit has substantially the same frequency as the external clock signal.

9. The semiconductor device of claim 8, wherein the first command is a read command.

10. The semiconductor device of claim 9, wherein read data from a memory array is received by the data input/output circuit in parallel in synchronization with the third clock signal, and wherein the data input/output circuit converts the read data from parallel to serial in synchronization with the data strobe signal.

11. The semiconductor device of claim 8, wherein the at least one clock line comprises a plurality of clock lines including a respective clock line for each of the frequency-divided second clock signals.

12. The semiconductor device of claim 5, wherein the frequency dividing circuit generates, when the command signal indicates a second command, one frequency-divided second clock signal, and the third clock signal generated by the multiplier circuit has a frequency that is less than the external clock signal.

13. The semiconductor device of claim 12, wherein the second command is a write command.

14. The semiconductor device of claim 13, wherein write data is received by the data input/output circuit in serial in synchronization with the third clock signal, and wherein the data input/output circuit converts the write data from serial to parallel in synchronization with the data strobe signal.

15. The semiconductor device of claim 1, wherein the semiconductor device is a dynamic random access memory (DRAM) device.

16. The semiconductor device of claim 1, wherein the semiconductor device is integrated on a single silicon chip.

17. The semiconductor device of claim 1, comprising third and fourth opposing sides elongated in a second direction perpendicular to the first direction, the third and fourth sides being parallel to each other.

* * * * *